(12) United States Patent
Tran et al.

(10) Patent No.: US 7,365,350 B2
(45) Date of Patent: Apr. 29, 2008

(54) METHOD AND ARRANGEMENT FOR THE SUPPRESSION OF DEBRIS IN THE GENERATION OF SHORT-WAVELENGTH RADIATION BASED ON A PLASMA

(75) Inventors: Duc Chinh Tran, Goettingen (DE); Jesko Brudermann, Goettingen (DE); Bjoern Mader, Hannover (DE); René De Bruijn, Goettingen (DE); Juergen Kleinschmidt, Goettingen (DE)

(73) Assignee: XTREME technologies GmbH, Jena (DE)

( * ) Notice: Subject to any disclaimer, the term of this patent is extended or adjusted under 35 U.S.C. 154(b) by 170 days.

(21) Appl. No.: 11/380,487

(22) Filed: Apr. 27, 2006

(65) Prior Publication Data
US 2006/0243927 A1 Nov. 2, 2006

(30) Foreign Application Priority Data
Apr. 29, 2005 (DE) .................. 10 2005 020 521.6

(51) Int. Cl.
*H04H 1/04* (2006.01)
(52) U.S. Cl. ............................. 250/504 R; 250/505.1
(58) Field of Classification Search ............ 250/504 R, 250/493.1, 505.1; 378/156, 158
See application file for complete search history.

(56) References Cited

U.S. PATENT DOCUMENTS

| 6,359,969 | B1 | 3/2002 | Shmaenok |
| 6,566,668 | B2 | 5/2003 | Rauch et al. |
| 6,586,757 | B2 | 7/2003 | Melnychuk et al. |
| 6,683,936 | B2 | 1/2004 | Jonkers |
| 6,867,843 | B2 | 3/2005 | Ogushi et al. |
| 7,250,620 | B2 * | 7/2007 | Wurm et al. ............ 250/504 R |

FOREIGN PATENT DOCUMENTS

| DE | 102 15 469 | 4/2002 |
| DE | 102 37 901 | 5/2004 |
| DE | 103 37 667 | 3/2005 |
| EP | 1 434 098 | 6/2004 |
| EP | 1 491 963 | 12/2004 |
| WO | WO 03/034153 | 4/2003 |

* cited by examiner

*Primary Examiner*—Kiet T. Nguyen
(74) *Attorney, Agent, or Firm*—Reed Smith LLP

(57) ABSTRACT

The invention is directed to a method and arrangements for the suppression of debris in short-wavelength radiation sources based on a plasma, particularly for EUV sources for semiconductor lithography. The object of the invention is to find a novel possibility for suppressing the particle flow (debris) from a plasma which keeps the debris away from primarily optical components located downstream without excessive attenuation of the desired radiation emitted from the plasma. According to the invention, this object is met in that a buffer gas is injected inside the filter structure of the debris filter lateral to openings that are provided for passing the radiation. The filter structure generates a flow resistance in direction of the plasma and in direction of propagation of the radiation so that an increased gas pressure of buffer gas remains limited to a defined volume layer in the debris filter relative to the pressure in the vacuum chamber, and the buffer gas exiting from the filter structure of the debris filter is sucked out of the vacuum chamber by vacuum pumps.

49 Claims, 11 Drawing Sheets

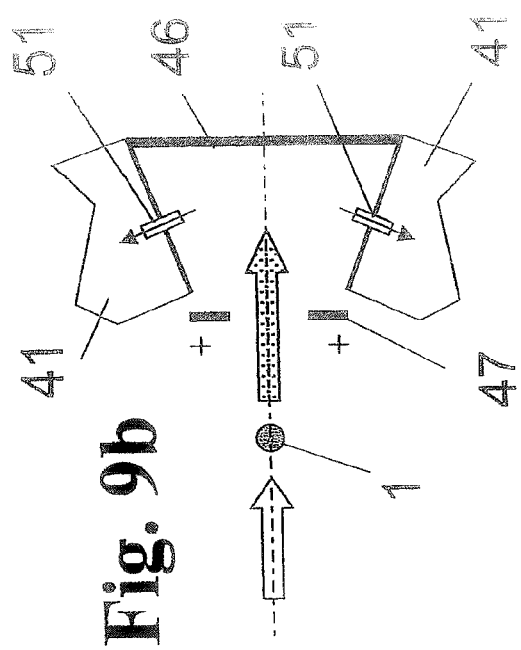
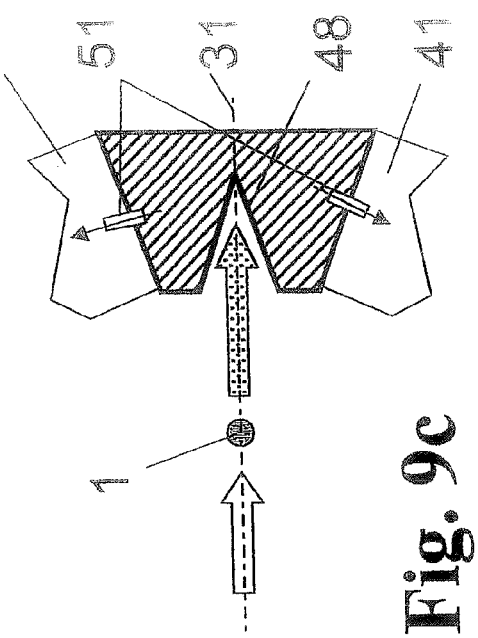
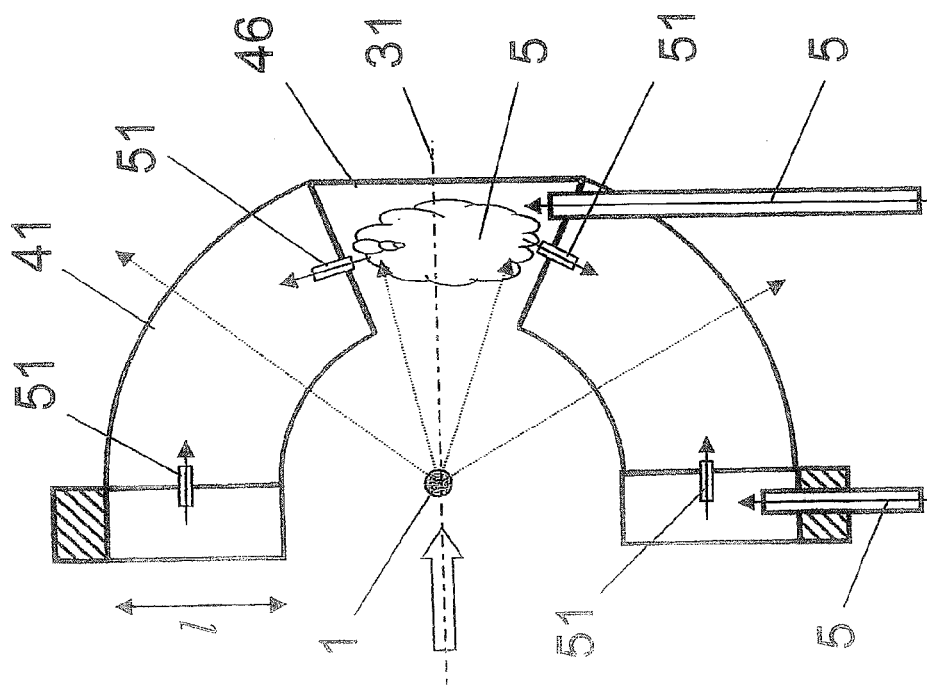

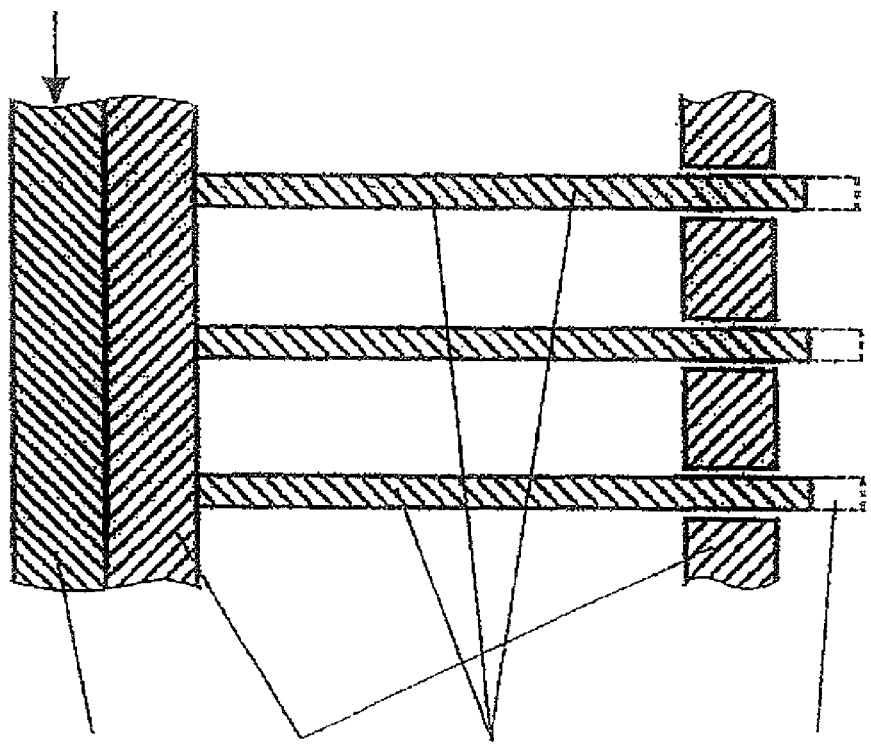
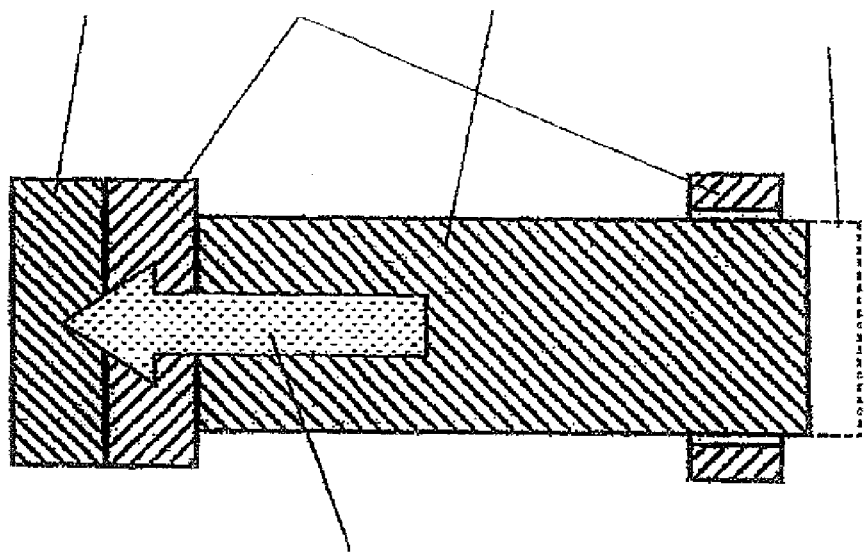
Fig. 11

METHOD AND ARRANGEMENT FOR THE SUPPRESSION OF DEBRIS IN THE GENERATION OF SHORT-WAVELENGTH RADIATION BASED ON A PLASMA

CROSS-REFERENCE TO RELATED APPLICATIONS

This application claims priority of German Application No. 10 2005 020 521.6, filed Apr. 29, 2005, the complete disclosure of which is hereby incorporated by reference.

BACKGROUND OF THE INVENTION a) Field of the Invention

The invention is directed to a method and arrangements for the suppression of debris in short-wavelength radiation sources based on a plasma in which the short-wavelength radiation that is emitted from the plasma and is in a vacuum chamber is directed through a debris filter with at least one mechanical filter structure before the short-wavelength radiation reaches the collector optics. It is preferably applied in EUV sources for semiconductor lithography.

Besides the desired EUV radiation, light sources for EUV radiation that are based on a radiation-emitting hot plasma also generate debris, as it is called. By debris is meant any form of particles that are undesirable within the meaning of the present application and that exit the plasma and negatively influence the performance or stability of the application components, particularly the life of optical surfaces.

Within the framework of EUV sources, the following types of debris can be distinguished:
  a) fast, high-energy atomic particles/ions which damage optical surfaces through sputtering (energies are typically 1-10 keV);
  b) slow particles which can deposit on optical surfaces (typical energies corresponding to a temperature of less than 5000 K or less than 1 eV);
  c) large macroscopic particles from electrode material.

In collector mirrors such as those used in microlithography for focusing the EUV radiation in an intermediate focus (multilayer mirrors or metallic mirrors with grazing light incidence), debris of type a) leads to a rapid loss of reflectivity through destruction of the sensitive coating. Since this effect is brought about by sputtering on the optical surface and the resulting removal of material, the decisive function of the arrangement according to the invention is either to eliminate the fast particles or to slow them down to kinetic energies significantly below 10 eV which no longer allow sputtering.

Failure to completely eliminate debris of type a) is due to the lack of availability of suitable materials which must be equally resistant to the considerable loading by both radiation and debris and which, on the other hand, must be highly transparent for the EUV radiation. Therefore, many different methods for reducing the particle flow have already been presented and discussed in a great many publications.

b) Description of the Related Art

For example, DE 102 15 469 B4 describes a debris filter in which means for generating an electrical field orthogonal to the central propagation direction of the divergent EUV beam bundle are arranged downstream of the outlet opening of the vacuum chamber and in which means are provided for generating a gas sink resulting in a particle flow parallel to the direction of the electrical field.

U.S. Pat. No. 6,359,969 B1 discloses a device containing a radiation source and a processing organ for processing the radiation of the radiation source. A filter containing a plurality of (planar) foils or plates oriented in radial direction from the punctiform radiation source is arranged between the radiation source and the processing organ.

U.S. Pat. No. 6,683,936 describes an EUV-transparent interface structure in the form of a membrane or channel structure for optically connecting a first and a second chamber while suppressing the contaminating particle flow of the source. Inside the chamber, an inert gas flow is directed sideways to or onto the source in order to keep the particles away from the application.

U.S. Pat. No. 6,566,668 B2 is directed to a high-energy photon source in which a pair of plasma pinch electrodes is arranged in a vacuum chamber. A debris collector between the pinch region and the radiation collector comprises a large number of passages, each of which is oriented toward the light beams, so that it passes the radiation and retards the debris which moves along more random paths. In addition, a flow of gas is directed toward the source location of the radiation in order to further slow the debris particles.

Further, DE 102 37 901 B3 describes a debris filter comprising a plurality of blades. The blades have the shape of essentially flat surfaces with a pair of parallel edges, are arranged so as to be uniformly distributed radially with respect to a given optical axis of the radiation source, and are arranged orthogonally between an inner enclosing surface and an outer enclosing surface which are arranged parallel to one another and rotationally symmetric so as to arch over the plasma for a preselected solid angle around the optical axis.

Similarly, the emission of debris from an x-ray source is prevented by a debris filter system according to U.S. Pat. No. 6,867,843 B2 in that an attraction unit has an attracting surface parallel to an axis passing through the emission point. Further, the debris filter has a rotation unit which rotates the attraction unit around said axis.

The known arrangements have the disadvantage that they are not equally effective for all types of particles or absorb too much EUV radiation. For example, neutral particles from the plasma are not influenced by electromagnetic fields. High field strengths combined with high voltages are necessary for influencing fast particles. Parasitic gas discharges may be caused by applying these voltages. Apart from increased shadowing effects, rotating blade filters have the disadvantage that very fast particles are only deflected corresponding to the rotating direction. The necessary high pressures are not achieved in gas flows or gas curtains, but a considerable proportion of the desired EUV radiation is also absorbed.

OBJECT AND SUMMARY OF THE INVENTION

The primary object of the invention is to find a novel possibility for suppressing the particle flow (debris) from a plasma which keeps the debris away from primarily optical components located downstream without excessive attenuation of the desired radiation emitted from the plasma.

In a method for suppressing debris in short-wavelength radiation sources based on a plasma in which the short-wavelength radiation emitted in a vacuum chamber from the plasma as source location is guided through a debris filter having at least one mechanical filter structure before this radiation reaches collector optics for focusing the radiation in an intermediate focus, the above-stated object is met, according to the invention, in that a buffer gas is injected inside the filter structure of the debris filter lateral to openings that are provided for passing the radiation, wherein the filter structure generates a flow resistance in direction of the plasma and in direction of propagation of the radiation so that an increased gas pressure of buffer gas remains limited to a defined volume layer in the debris filter relative to the pressure in the vacuum chamber, and the buffer gas exiting from the filter structure of the debris filter is sucked out of the vacuum chamber by vacuum pumps.

The buffer gas is preferably injected into an intermediate space between two filter structures.

In a particularly advantageous manner, the buffer gas is injected into an intermediate space between two filter structures with constricted channels (openings for the passage of radiation).

Further, it is advantageous when additional buffer gas is directed into an antechamber in front of the debris filter in order to achieve a pre-deceleration of particularly high-energy debris particles. The antechamber is preferably filled with residual gas which flows out of the discharge chamber for generating the plasma and places a substantial proportion of buffer gas in this region. The buffer gas can advantageously be sucked out of the antechamber into the vacuum chamber through outlet openings in order to minimize the buffer gas flowing out of the antechamber through the filter structure or can be sucked out of the antechamber directly by separate suction pumps in order to adjust a defined gas pressure in the antechamber on the order of 10 Pa.

In commonly used mechanical filter structures which are outfitted with a central diaphragm, it is advisable to introduce buffer gas into the central diaphragm of the debris filter in order to suppress erosion of the diaphragm, particularly due to a self-focusing electron beam.

In order to increase the gas pressure in the debris filter which drops continuously as a result of the buffer gas flowing out through at least one filter structure into the vacuum chamber, it is advantageous that the buffer gas pressure is increased by bursts synchronous to the pulsed radiation generation by means of a pulsed influx into the filter structure.

Further, in an arrangement for the suppression of debris in short-wavelength radiation sources based on a plasma in which a debris filter having at least one mechanical filter structure is arranged in a vacuum chamber between the plasma, as source location of the emitted short-wavelength radiation, in front of collector optics for focusing the radiation in an intermediate focus, the above-stated object is met, according to the invention, in that inlet nozzles for injecting buffer gas into the filter structure are arranged inside the filter structure of the debris filter lateral to the openings that are provided for the passage of the radiation, wherein the filter structure has a flow resistance in direction of the plasma and in direction of propagation of the radiation so that a defined volume layer in the debris filter has an increased gas pressure of buffer gas compared to the pressure in the vacuum chamber, and in that at least one vacuum pump for evacuating the vacuum chamber is also provided for sucking out the buffer gas exiting from the filter structure of the debris filter.

The debris filter advantageously has at least one blade structure. In this connection, the debris filter contains closely adjacent blades which are preferably oriented radial to the optical axis of the collector optics and at least two supporting rings for the blades which are oriented in a conical shape toward the source location.

The debris filter can advisably have a different quantity of radially oriented blades between different pairs of supporting rings, wherein the quantity of blades increases outward from the optical axis. The debris filter advisably has at least two pairs of supporting rings, wherein the quantity of blades between a pair of supporting rings situated farther toward the outside is greater than the number of blades between the closest pair of supporting rings toward the inside. In a preferred construction, the number of blades between supporting rings is approximately twice that of the blades between the closest supporting rings toward the inside, so that the angular distance between adjacent blades is always on the order of 1 mm.

For a particularly advantageous filtering of debris, the debris filter has two filter structures with a parallel volume layer situated therebetween for injecting buffer gas.

The filter structures advisably have a greater flow resistance for the buffer gas because of a reduced diameter of the openings for the passage of radiation. In this way, a higher buffer gas pressure can be adjusted between the filter structures. The increased buffer gas pressure substantially improves the efficiency of the debris filter because the product of buffer gas density and path (path of interaction with the debris particles) is increased without having to increase the amount of buffer gas supplied for increasing gas pressure. Since the quantity of buffer gas (which is supplied to the debris filter and flows out under vacuum) does not increase, the vacuum system can also be dimensioned in a more economical manner.

The filter structures advantageously have a smaller structural depth in direction of the radiation from the plasma, and a higher buffer gas pressure can be adjusted while maintaining the same supply of buffer gas between the filter structures so that the reduced structural depth does not result in a reduced product of debris particle path and buffer gas density or diminish the filtering action.

To increase the flow resistance, the filter structure can advantageously be constructed as a hexagonal structure, wherein conical or cylindrical holes are introduced in the hexagonal elements.

In another advantageous construction, the filter structure with increased flow resistance can be constructed as a filter plate, wherein holes are suitably arranged in the filter plate for passing the radiation emitted by the plasma.

In a particularly advantageous manner, radially oriented elongated holes or slots are introduced in the filter plate.

The filter structure of the debris filter advantageously has a circular central diaphragm. This central diaphragm is advantageously constructed as a diaphragm cup which opens toward the plasma and in which buffer gas is introduced in order to prevent erosion and destruction of the diaphragm by debris. In addition, an electric lens (generation of an electric field or magnetic field) can be arranged around the opening of the central diaphragm for deflecting charged particles, particularly electrons.

In another advantageous construction, the central diaphragm is solid and is provided with a conical pocket hole that is introduced symmetric to the optical axis.

Because of the heat acting upon the debris filter from the plasma (through radiation and debris), the blades are preferably rigidly fixed only in one supporting ring and are guided in a sliding manner in the other supporting ring so as to enable thermal expansion of the blades without warping. A cooling structure can also be arranged at the supporting ring at which the blades are rigidly fixed.

Further, it is useful to actively cool the filter structure of the debris filter by means of a cooling circuit to further increase the density of the buffer gas.

The filter structure of the debris filter can advantageously be cooled by means of the cooling circuit in such a way that temperature is maintained at a minimum value which lies above the condensation temperature of materials that are solid under normal conditions and are in at least partially vaporized state in the vacuum chamber. The minimum value to which the temperature is controlled can be meaningfully adjusted in such a way that the surface temperature of the filter structure lies above the condensation temperate (dew point) of a utilized target material that is solid under normal conditions.

The filter structure of the debris filter is advisably made from heat-resistant material with good thermal conductivity because of the high thermal loading (from radiation energy and kinetic energy from debris particles). The filter structure is preferably made from at least one of the metals tungsten, molybdenum, or alloys thereof.

In order to increase the buffer gas density in the debris filter without increasing the gas load in the vacuum chamber, at least one valve is advantageously provided for injecting the buffer gas into the filter structure of the debris filter. This valve is operated by bursts so as to be synchronized with a pulsed radiation generation from the plasma. The pulsed valve can either be synchronized to every individual radiation pulse from the plasma or is actively continuously switched in a synchronized manner by a burst from radiation pulses from the plasma.

Inlet nozzles which are suitable for a supersonic nozzle jet expansion of the buffer gas into the intermediate spaces of the filter structure are preferably provided for injecting buffer gas laterally under high pressure.

Inert gases, preferably noble gases, are used as buffer gas. The buffer gas is advantageously a mixture of at least a heavy gas and a light gas in order to achieve faster injection and better thermal conductivity.

The blade structure of the debris filter is advantageously constructed so as to be insulated in such a way that an additional deflection of charged debris particles is possible by applying high-voltage pulses. In a particularly advantageous manner, the blade structure is insulated in such a way that the charging of the filter structure for deflecting charged debris particles is provided by a self-focused electron beam impinging on the central diaphragm.

Further, the blade structure can be constructed in such a way that adjacent blades can be charged in a pulsed manner with different potential. Further, it is advisable for preventing parasitic discharges in the vacuum chamber to apply a defined potential (e.g., ground) to the blade structure at least occasionally.

For applications with especially strict requirements with regard to absence of debris in the radiation source, it may be useful to arrange a similarly constructed debris filter in the vicinity of the intermediate focus in order to further reduce the debris.

For purposes of adjusting and monitoring optimal filter operation, a sensitive sensor is advantageously arranged immediately downstream of the debris filter. This sensor can advisably be a film sensor with a tunable quartz resonator, a miniaturized mass spectrometer, or a time-of-flight spectrometer. The sensor is advantageously used for regulating active filter parameters for debris suppression, preferably of buffer gas pressures, injection angles, voltages, or pulse synchronization. However, it can also be used for generating an error report for the control of the plasma generation or of a superordinate lithography system.

The basic idea behind the invention proceeds from the consideration that mechanical debris filters in the stationary state still pass a considerable proportion of debris and that when they are moved (preferably in rotation around the optical axis of the collector optics) in order to improve filtering action promote other unwanted contamination effects at the optical components. However, known flushing of the openings of the debris filter structure with counter-flowing buffer gases causes considerable absorption of the emitted EUV radiation and shadowing effects because the effective area for particle deceleration extends far beyond the length of the blades.

Therefore, the basis of the invention resides in that a buffer gas volume that is limited in a defined manner is introduced inside the known blade-like structure of the debris filter arrangement and decelerates and/or deflects the unwanted debris particles in such a way that they deposit on surfaces of the filter structure before reaching the optical components. Therefore, the reflectivity of the collector optics which intercept and focus the radiation emitted from the plasma is maintained over a longer period of time and maintenance costs and operating costs are accordingly reduced. In addition, the life of the debris filter is also prolonged.

The solution according to the invention makes it possible to suppress the particle flow (debris) from the source location of a plasma-based radiation source allowing the destructive debris to be effectively kept away from primarily optical components arranged downstream without excessively attenuating the desired radiation emitted from the plasma.

The invention will be described more fully in the following with reference to embodiment examples.

BRIEF DESCRIPTION OF THE DRAWINGS

In the drawings:

FIGS. 9a to 9c show a variant of the debris filter with a modified central diaphragm which has—primarily for absorption of a directed electron flow—a) a gas volume, b) an electric lens, or c) a conical pocket hole;

FIG. 11 shows a section from a debris filter structure in a (sectional) side view and radial section, wherein the blades are fastened in a cooled conical holding ring on one side and are guided in a sliding manner in another holder (or central diaphragm) on the other side in order to allow thermal expansion of the blades without tension states.

DESCRIPTION OF THE PREFERRED EMBODIMENTS

Figure 1:
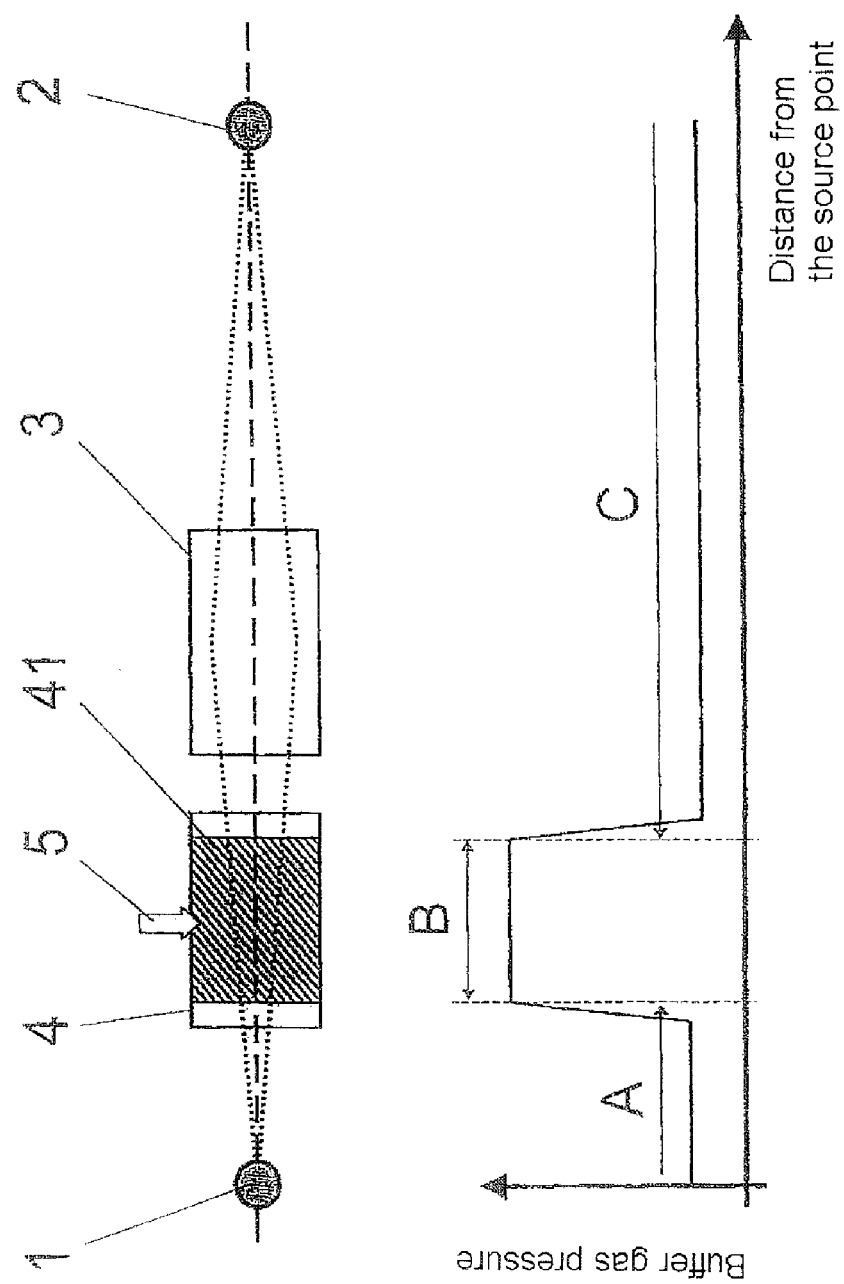
FIG. 1 schematically shows a plasma-based source with a debris filter, according to the invention, through which a buffer gas volume passes.

The basic principle of the invention—as is shown in FIG. 1—consists in that a debris filter 4 is arranged between the radiation-emitting plasma 1 and an intermediate focus 2 that is generated by collector optics 3 as a conjugate imaging of the source location (plasma 1). An increased gas pressure of a suitable buffer gas 5 is generated within the volume of the debris filter 4. The flow resistance of a (mechanical) filter structure 41 of the debris filter 4 is used for limiting the gas load for the surrounding vacuum chamber 6 (shown only in FIG. 4). Inside the filter structure 41, the buffer gas 5 is injected lateral to the direction of the passage of radiation. Any noble gas, but preferably one with a heavy atomic weight (such as argon or krypton) because of their better braking effect on high-energy debris particles, can be used as buffer gas 5. Other inert gases or mixtures of inert gases and/or noble gases can also be used, particularly to increase thermal conductivity.

Through the use of the buffer gas 5 in a defined volume along the distance between the plasma 1 and collector optics, debris is effectively kept away in that the fast debris particles are increasingly decelerated by many collisions with the gas particles of the buffer gas 5 until they reach the average thermal speed of the buffer gas 5 and therefore become too weak for sputtering processes on optical surfaces (e.g., of the collector optics 3). The decisive parameter for deceleration is the integral of path times density of the buffer gas:

$$\int_{plasma\ position}^{optics} \rho \cdot dr$$

where ρ is the density of the buffer gas [particles/cm³] and r is the distance traveled by the debris particles emitted from the plasma 1.

Since the plasma 1 is generated in a vacuum chamber 6 and vacuum atmospheres (usually <2 Pa) are also needed to prevent radiation absorption along the optical path of the generated EUV radiation to the application, a buffer gas zone is created in a defined limited volume inside the debris filter 4. Due to its flow resistance (even though it is small in conventional constructions), the filter structure 41 of the debris filter 4 constitutes the transition from a region B with high buffer gas density in the interior of the filter structure 41 to regions A and C of the vacuum chamber 6 (see FIG. 4) which are located, respectively, to the left and right of the filter structure 41 (bottom of FIG. 1). The pressure curve of the buffer gas is depicted in a purely qualitative (exaggerated) manner in FIG. 1.

In the following, a number of arrangements for introducing a buffer gas volume of the type described above between the plasma 1 and collector optics 3 are suggested for optimizing the filter characteristics according to the invention.

A combination of a buffer gas volume of sufficient density and a blade structure 42, such as is already known in principle from German Patent DE 102 37 901 B3, is well suited for this purpose. In a blade structure 42 of this kind, as is shown again in modified form in FIG. 1, even a small deflection of the debris particles by means of buffer gas 5 that is injected laterally is sufficient to absorb the particles on the blade structure 42. In this connection, the blade structure 42 assumes the task of keeping the buffer gas 5 with high density within a defined volume by means of its flow resistance.

Figure 2:
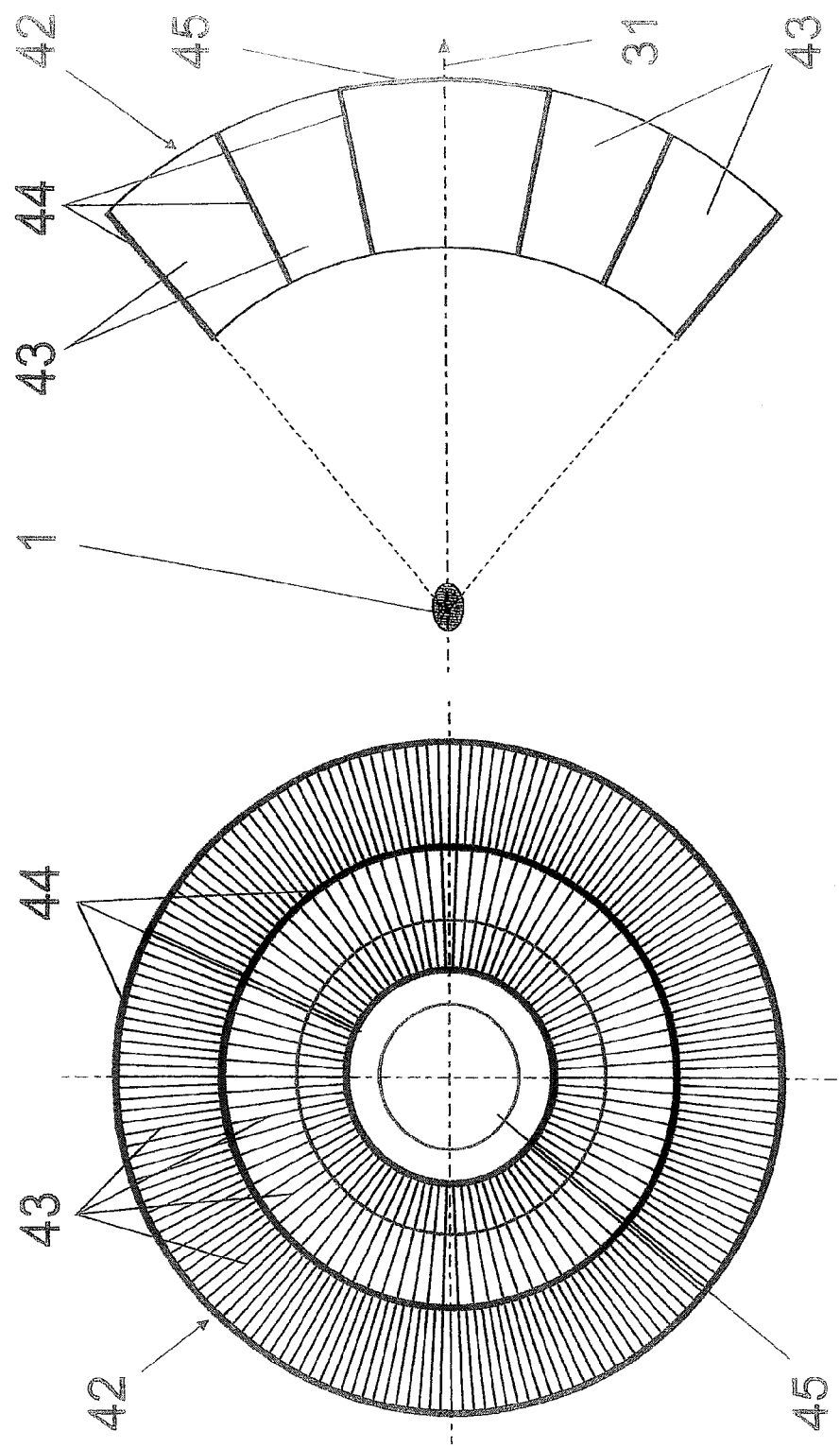
FIG. 2 shows a construction of the debris filter with blade structure in a top view (viewed away from the radiation source) and in a side view in section.

As is shown in FIG. 2, a suitably modified basic construction (based on DE 102 37 901 B3) comprises an arrangement of thin blades 43 (foils) which are oriented with respect to the (almost punctiform) radiation source (plasma 1) in such a way that the shadow cast by each blade 43 is minimal. It is essential for the effectiveness of the debris filter 4 that the blade structure 42 has a large surface which affords the possibility of condensation (adhesion) for the debris particles which are emitted from the plasma 1 and are then deflected or decelerated.

In order to implement the invention—without limiting generality—a debris filter structure 42 in used, in which—as is shown in FIG. 2 in a top view and side view—very thin (thickness of approximately 100 μm) blades 43 are oriented radial to the optical axis 31 (of the collector optics 3). This blade structure 42 is particularly advisable because it does not lead to additional shadowing in case the light source (e.g., a Z-pinch plasma) has a certain expansion along the axis of symmetry of the filter (which is identical to the optical axis 31 of the collector imaging).

By means of a few supporting rings 44 which are shaped as outer conical surfaces, it is possible to insert a larger quantity of blades 43 in the outer area of the debris filter 4 (e.g., 180 blades 43 in the inner area compared to 360 blades 43 on the outside, or even 720 in a pair of supporting rings located farther outward) so that the ratio of filter depth l (=blade length) and blade spacing, which ratio is important for the suppression of debris, is also kept large in the outer region. A value of approximately 40-150 mm is selected for the filter depth l, preferably approximately 1 mm for the spacing of the blades 43. This corresponds to an angle of approximately ½ to 2° between adjacent blades 43.

Figure 3:
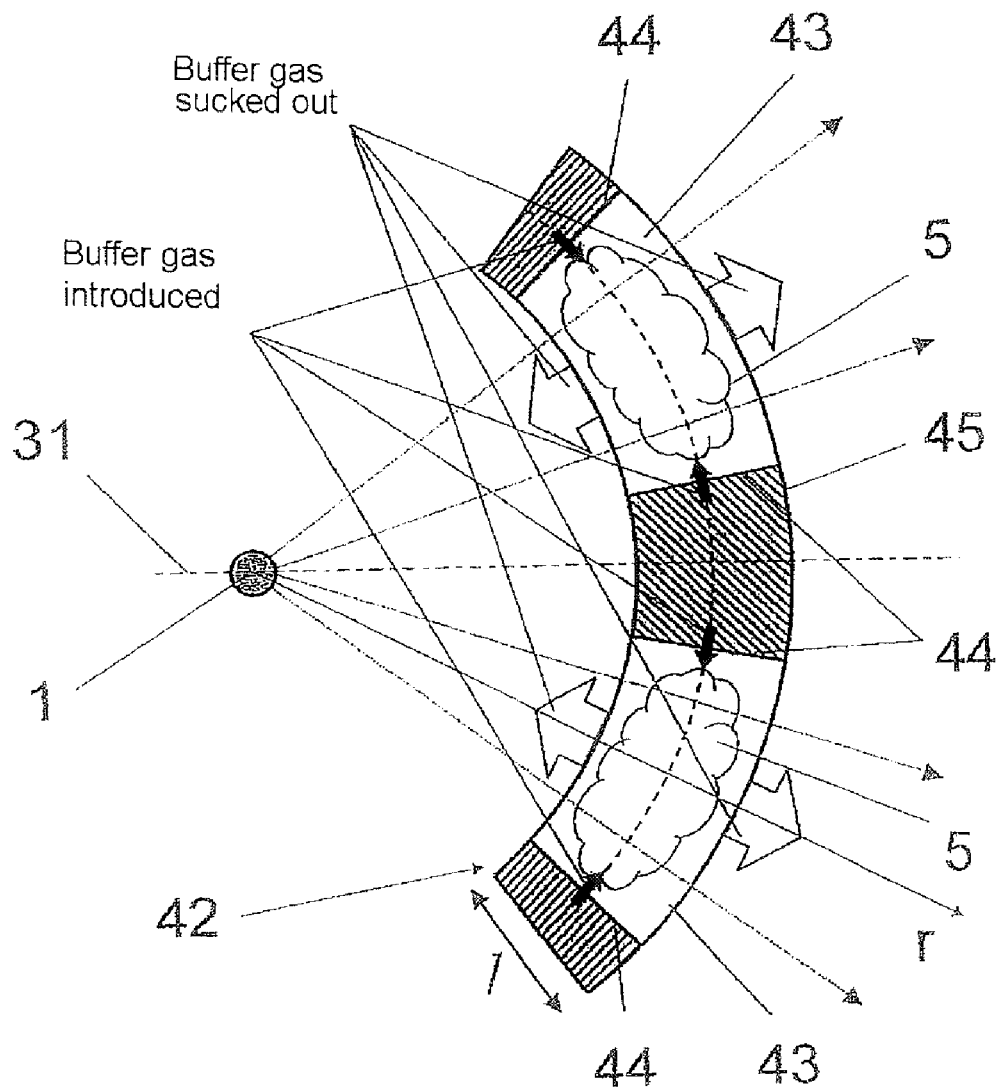
FIG. 3 shows a sectional view of the debris filter in which the buffer gas is introduced in the debris filter into each individual intermediate space between the radial blades central to the blade length (filter depth)

Based on the above-described debris filters 4 which are known, per se, a defined buffer gas volume (which is relatively thin-layered with respect to the radiation propagation) is introduced (FIG. 3). The buffer gas 5 is injected at suitable locations, preferably in the center of the blade length l tangential (circular) to the center of curvature of the blade structure 42, into the intermediate spaces between the blades 43 from the outside along the line shown in dashes (FIG. 3). The exact position and direction of the nozzles 51 (shown only in FIG. 4) may vary; in general, it is most advantageous to inject exactly in the center of the blade depth l. When the blade structure 42 is not divided (radial to the plasma), the buffer gas is injected into each blade gap simultaneously. Since the area around the optical axis 31 is not permeable because of the geometry of the selected blade structure 42 and since the collector mirror 31 for grazing light incidence, as is assumed in FIG. 3 (but shown only in FIG. 4a), also does not collect radiation from this area, the buffer gas 5 can also be injected into the intermediate spaces of the blades 43 from the optical axis 31 (axis of symmetry of the debris filter) without an additional shadowing effect.

The buffer gas 5 exits from the blade structure 42 radially with respect to the plasma position in both outward directions and is pumped out by the vacuum pumps 61 (both shown only in FIG. 4) which are connected to the vacuum chamber 6. Accordingly, a spherical shell layer of buffer gas 5 forms inside the blade structure 42 and pressure drops quite steeply outward from the center of the blade structure 42 on both sides corresponding to FIG. 8*a*.

The advantage of this novel filter construction resides in the direction in which the buffer gas is injected lateral to the propagation of the EUV radiation so that only a very limited "layer thickness" of buffer gas 5 is formed inside the entire solid angle region that is used. Accordingly, a very good braking effect is achieved for fast, superthermal debris particles due to collisions with buffer gas atoms with hardly any noticeable radiation absorption.

Another operative mechanism that takes place, according to the invention, by injecting the buffer gas 5 into the debris filter 4 in orthogonal direction to the openings of the filter structure 41 and, therefore, lateral to the movement direction of the debris particles improves the deposition of debris particles at the surfaces of the blades 43. A third (smaller) component of the filtering effect of the buffer gas 5 occurs because of a counterflow of the buffer gas 5 flowing out through the openings of the filter structure 41 in direction of the source location of the radiation (plasma 1) so that the braking effect on fast debris particles is further increased.

Figure 4:
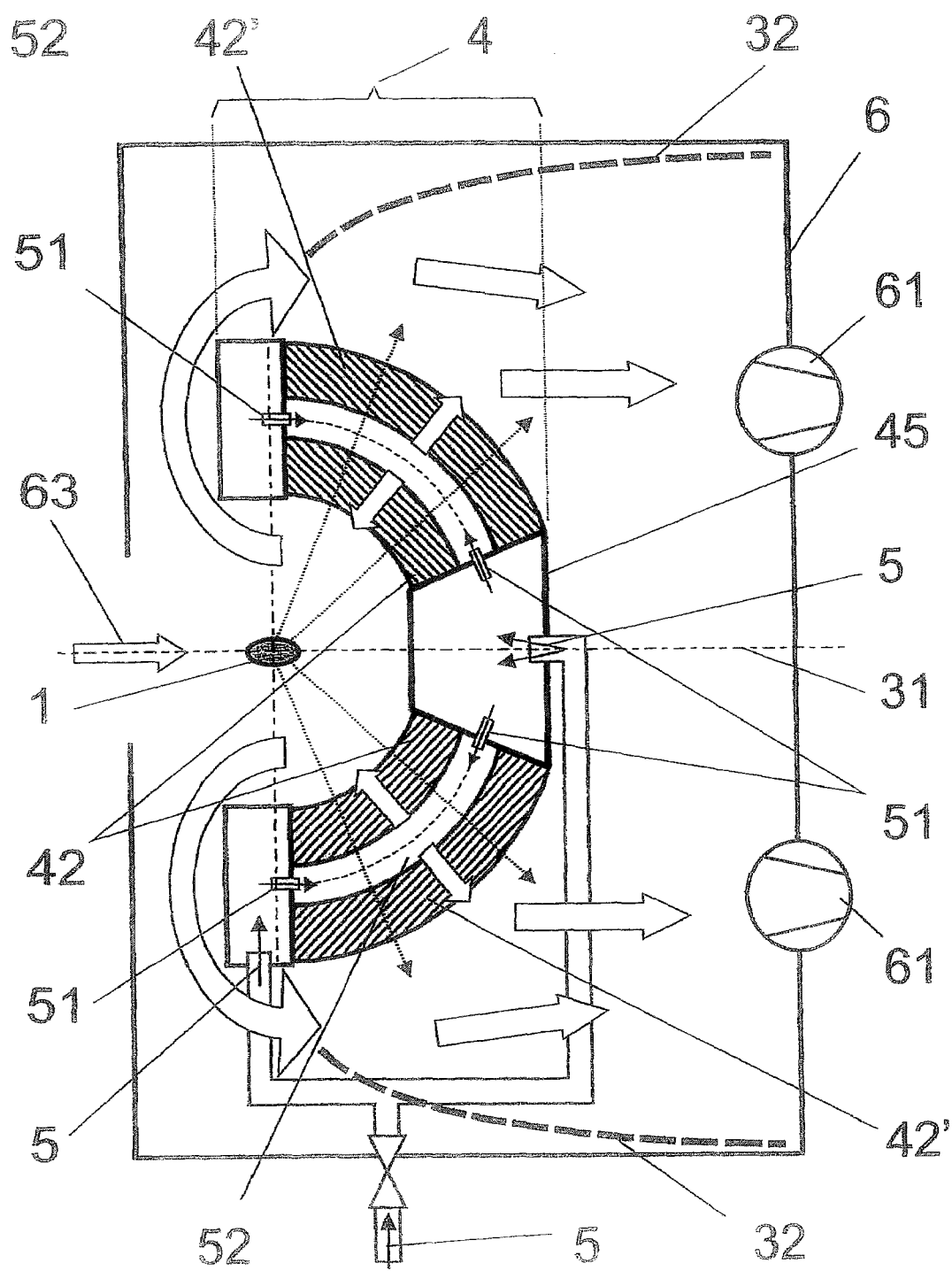
FIG. 4 shows a schematic overall view of an EUV source with a debris filter comprising two blade structures which are arranged one behind the other and into whose intermediate spaces buffer gas is injected tangentially.

In a particularly improved variant of the invention shown in FIG. 4, the debris filter 4 comprises two concentric blade structures 42 and 42' (structure depth of about ½ l of the type shown in FIG. 2) so that a spherical shell layer remains free therebetween for filling with the buffer gas 5. This free volume, intermediate space 52, is used for filling with buffer gas 5.

As was already described above, the buffer gas nozzles 51 are arranged tangentially in the center to allow the buffer gas 5 to be injected along the line shown in dashes (representing a spherical shell three-dimensionally). When injecting the buffer gas 5, care must be taken to inject it exclusively in the intermediate space 52 between the blades 43 so that it can only escape therefrom slowly into the vacuum chamber 6 through the openings of the blade structures 42 and 42'. In this way, a defined (quasi-static) pressure can be adjusted in the intermediate space 52 although buffer gas 5 flows off continuously over the flow resistance of the blade structures 42 and 42'. When the buffer gas nozzles 51 are directed to a substantial extent in direction of the openings of one of the blade structures 42, 42', the buffer gas 5 contributes appreciably less to the effective absorption of debris particles during the unavoidable increase in the gas load (increased gas pressure) in the vacuum chamber 6.

Due to the flow resistance between the blades 43 relative to the free intermediate space 52, there is an appreciable increase in the buffer gas pressure (of approximately 10 Pa) relative to the vacuum chamber pressure (typically <2 Pa). The low pressure in the vacuum chamber 6 is required because a very high absorption of the generated EUV radiation would result otherwise (assuming typical optical path lengths of about 1 m in semiconductor lithography). The buffer gas 5 is pumped out radially through the blade structure 42 at the side of the plasma 1 and through the blade structure 42' by the vacuum pumps 61 (both shown only in FIG. 4) that are connected to the vacuum chamber 6.

The improvement in the filtering effect (for all debris particles) which is achieved in this variant according to FIG. 4 is brought about by the (relatively thin) spherical shell layer of the buffer gas 5 inside the intermediate space 52 between the blade structures 42 and 42'. A higher buffer gas pressure and a higher pressure gradient can also be adjusted as can be seen from the schematic view in FIG. 8*b*.

Due to the free volume (spherical shell layer between the blade structures 42 and 42'), a defined increase in buffer gas pressure (relative to the vacuum chamber 6) results in the intermediate space 52 because the buffer gas 5 is distributed homogeneously due to the flow resistance of the surrounding blade structures 42 and 42'. In the present case, with the surrounding filter structure 41, the buffer gas pressure is defined by the following variables:

mass flow of gas through the buffer gas line(s),
suction power of the vacuum pumps (shown only in FIG. 4), and
conductance (as reciprocal of the flow resistance) of the blade structure.

Generally, as regards forming the higher-pressure buffer gas layer within the surrounding filter structure 41, the greater the ratio of suction power of the vacuum pumps 61 and conductance of the two blade structures 42 and 42', the greater the ratio of the pressures within the debris filter 4 and within the vacuum chamber 6. In other words, at a given pressure in the vacuum chamber 6, a still higher pressure can be achieved in the debris filter 4 the greater the ratio of suction power to conductance. Since the suction power of the vacuum pumps 61 is limited, the ratio is essentially adjusted by reducing the conductance (increasing the total flow resistance of the filter structure 41).

Accordingly, the arrangements described above can be further improved in that a complete filter structure 41—as is shown at bottom in FIG. 6*a*—comprises two filter structures with increased flow resistance.

Figure 5:
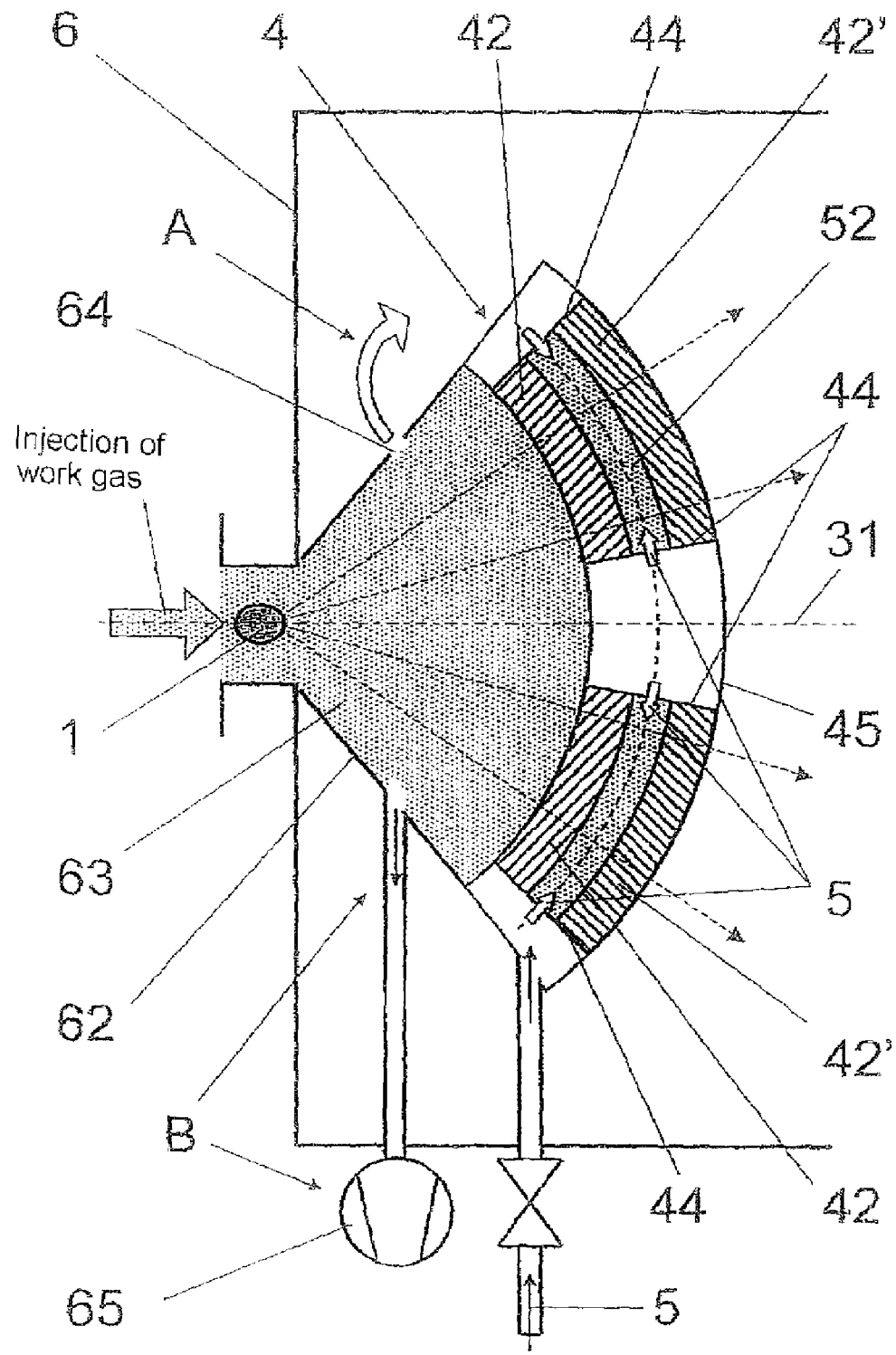
FIG. 5 shows a variant of the debris filter with buffer gas injected between two concentric filter structures and with an additional higher-pressure antechamber which is fed, e.g., by a mixture of work gas and buffer gas of a gas discharge source.

FIG. 5 shows another modification of the invention which is based on the construction of the debris filter 4 according to FIG. 4 and is suitable particularly for EUV sources based on a gas discharge (GDPP sources) which, in addition to the active work gas, also use an admixture of buffer gas in the discharge chamber.

In this construction, buffer gas 63 which flows out of the discharge chamber (shown only schematically as an outlet in FIG. 5) and which is used for the gas discharge is utilized for building an increased gas density for a first deceleration of debris particles in an antechamber 62 that is arranged in front of the debris filter 4.

In a variant designated as "A", the antechamber 62 advantageously has outlet openings 64 by means of which the buffer gas 63 (proportion of residual gas from the discharge) originating in the gas discharge flows out into the vacuum chamber 6 in order to extensively prevent an exit through the blade structure 42 in the debris filter 4.

In a variant "B", the antechamber 62 has at least one suction pump 65 which is connected directly to the outlet openings and which allows (separately from the vacuum pumps 61) a defined gas pressure between 1 and 20 Pa to be adjusted in the antechamber 62. In this way, the action of the subsequent debris filter 4 can be reinforced in a monitored manner and optimized.

The buffer gas 5 which is injected laterally within the two filter structures 42 and 42' provides for the main deceleration of the debris particles in the debris filter 4 based on the principle of the defined volume layer inside the debris filter 4 in the same way as described above with reference to the construction shown in FIG. 4.

In a preferred construction which is described with reference to FIG. 6*a*, the filtering action of the gas volume within two surrounding filter structures 41 can be further increased without increasing the gas load in the vacuum chamber 6 through exiting buffer gas 5. For this purpose, two parallel filter plates 53 and 54 are provided which offer an increased flow resistance to the buffer gas 5.

These filter plates 53 and 53, which need not necessarily be flat, have a distance from one another (as in the construction of the intermediate space 52 shown in FIG. 4) which forms a parallel enclosed volume which is referred to in this example as a gas cell 55 because the buffer gas 5 located therein can be distributed more homogeneously due to the increased flow resistance of the filter plates 53 and 54 and an even higher buffer gas pressure can be adjusted.

Referring to FIG. 2 which was described above, filter plates 53 and 54 of the type mentioned above having an increased flow resistance can be produced in that the blade structure 42 used therein is constricted in that a plurality of supporting rings 44 which are shaped as conical shells and have (at least in part) the same (or similar) material thickness as that of the radially arranged blades (FIG. 2) are constructed and arranged as is shown schematically in FIG. 6b. They can accordingly be arranged with a similarly close spacing (like the radially diverging blades, preferably 1-2 mm).

In this case, the channels 57 formed in this way (as reduced openings of the blade 32 (shown only in FIG. 4) and which at the same time allow the buffer gas 5 to flow out of the interior of the blade structure 42 in its entirety are no longer defined only with respect to a plane by two divergent surfaces, but rather have an approximately quadratic cross section which increases with increasing distance from the source location (plasma 1) so that, in their entirety, they have the shape of a truncated pyramid. This leads to an appreciably increased flow resistance for the buffer gas 5 with a somewhat poorer optical transmission of the debris filter.

As a result, a higher buffer gas pressure can be adjusted in the gas cell 55 with the buffer gas flow through the buffer gas nozzles 51 of the debris filter 4 remaining the same. This contributes (referring to FIG. 8d) to the desired increase in the integral over the product of path length and gas density.

Figure 6:
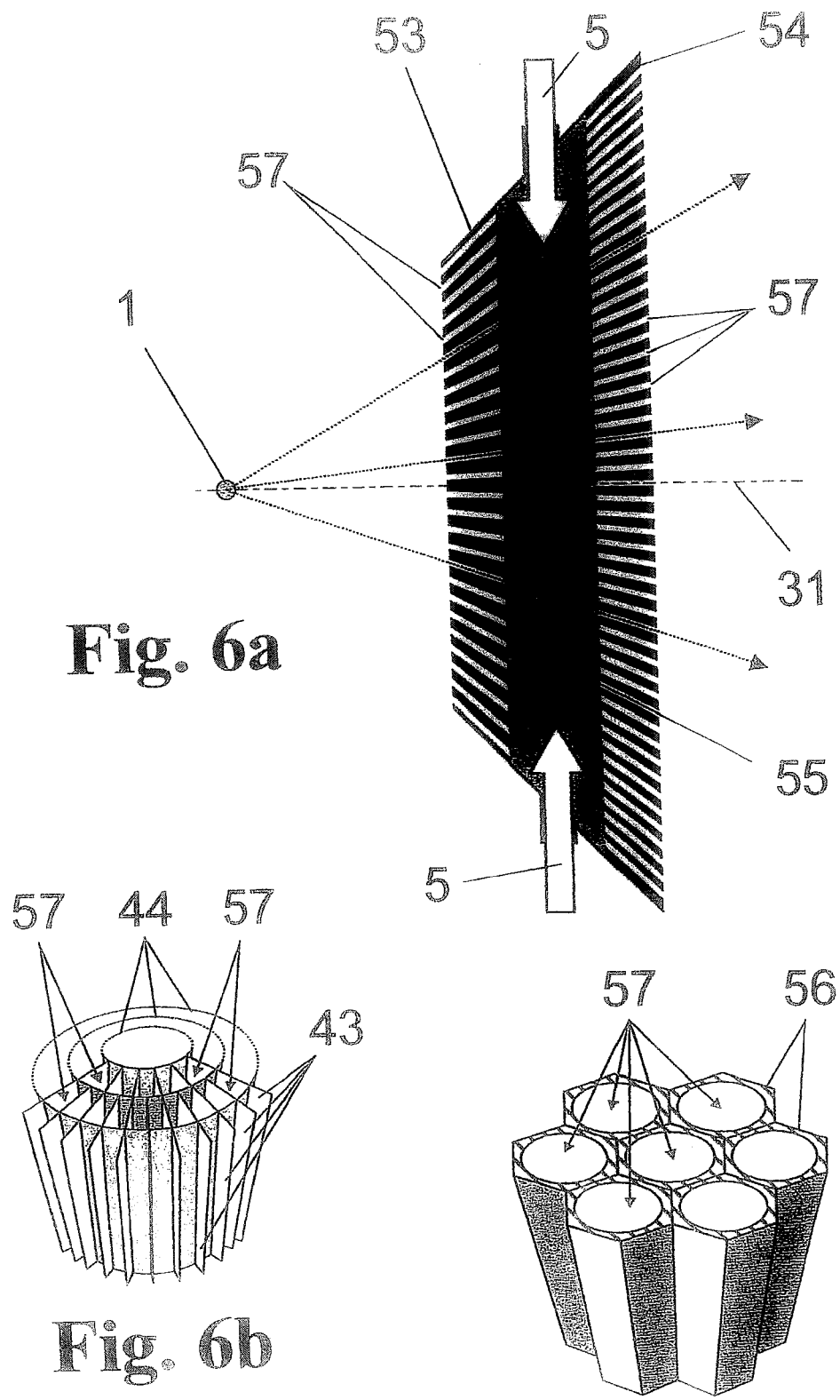
FIGS. 6a to 6c show a modified construction of a debris filter in which two filter plates with increased flow resistance due to constricted openings (channels) form a kind of gas cell for generating a substantially increased buffer gas pressure that is spatially limited in a defined manner.
Figure 7:
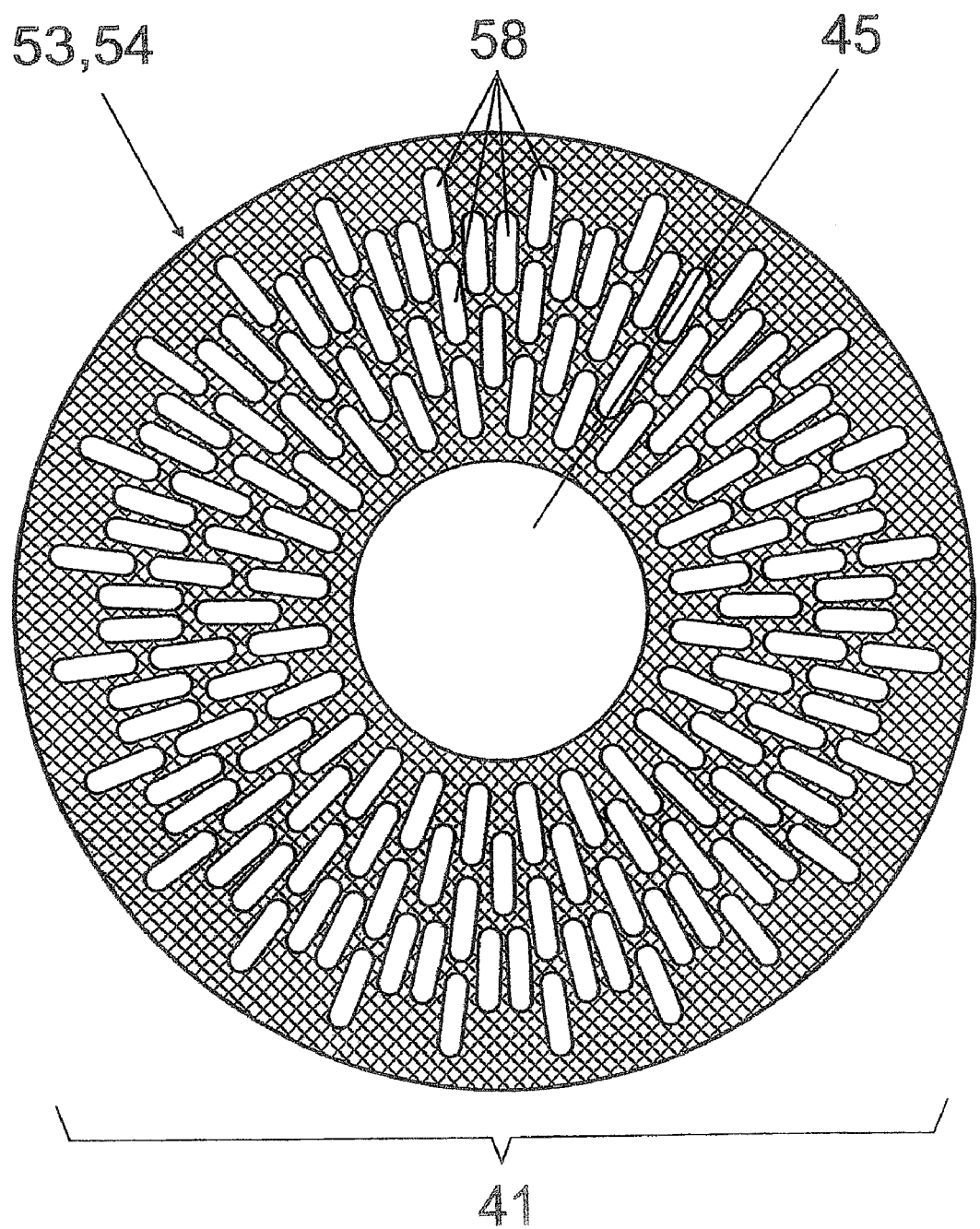
FIG. 7 shows a top view of a possible filter structure for a debris filter comprising two parallel metal plates.
Figure 8:
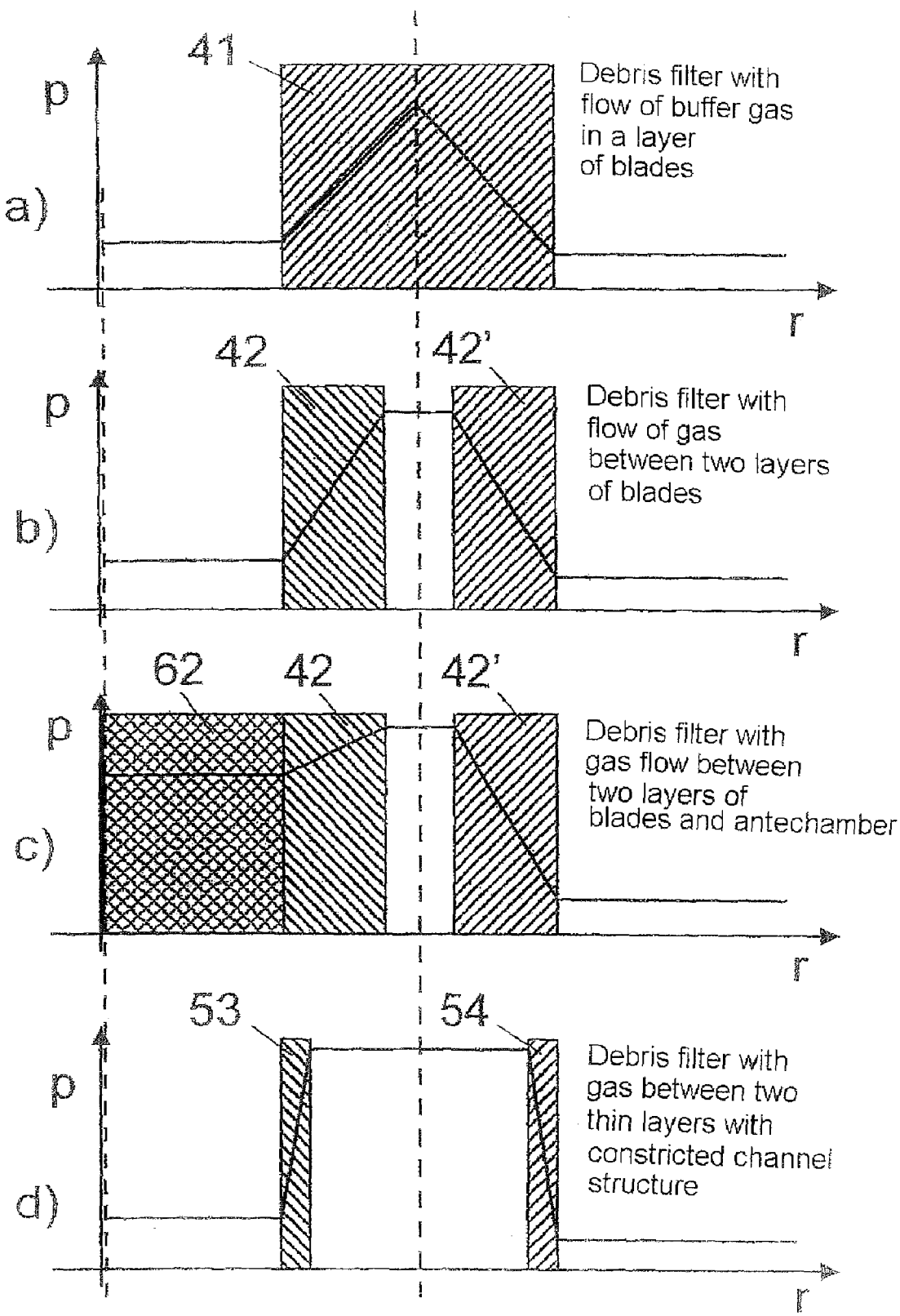
FIG. 8 shows schematic views of pressure profiles in different filter structures with injected gas: a) in a unitary blade structure according to FIG. 3, b) between two concentric blade structures according to FIG. 4, c) between two filter structures with an additional higher-pressure antechamber according to FIG. 11, d) with increased buffer gas pressure between two filter structures with constricted channels according to FIG. 6.

FIG. 8 shows a comparison of the working profiles of the different filter structures of the filter variants shown in FIGS. 2 and 3, FIG. 4, FIG. 5, and FIGS. 6 and 7. The arrangement of FIGS. 6 and 7 is distinguished by the best homogeneity of the buffer gas volume within the cell 55 (or intermediate space 52) of the debris filter 4.

In general, debris particles (regardless of whether they are charged or uncharged, fast or slow) are intercepted in an optimal manner in the buffer gas volume between the two filter structures 42, 42' or 53, 54 of the debris filter 4. In addition, the action of the buffer gas 5 remains spatially limited to the desired area (in front of the collector optics 3) and does not lead to an extinction of the EUV radiation as it continues over the optical beam path.

A further limiting of the volume of the buffer gas 5 at high pressure can be achieved when desirable by increasing the flow resistance of the filter structure 41.

By abstracting to the hexagonal structure 56 shown in FIG. 6c, the total conductance L of the debris filter 4 can be estimated as follows by means of the known relationship for flow resistance $W_R$ in thin tubes:

$$L = \frac{1}{W_R} = 12.1 \cdot \frac{d^3}{l} \cdot f(p,d) l \cdot s^{-1}.$$

The function $f(p,d)$ adopts the value of 1 in the case of molecular flow and is dependent upon pressure with values greater than 1 at higher pressures (transitional flow, viscous flow).

With typical dimensions of the tubular channels 57 of the hexagonal structure 56 of 1 cm and typical pressures of 0.1 mbar, the system lies within the region of transition between molecular flow and laminar flow when p·d=0.1 mbar·cm. In this case, the conductance of the hexagonal structure 56 is already slightly pressure-dependent and is higher than would be the case with a purely molecular flow. Therefore, a reduction in conductance can be achieved by reducing the dimensions and accordingly changing them completely to the domain of molecular flow.

However, when the channels 57 are reduced, the conductance is additionally changed by the altered geometry. In this case, $L \sim d^3$. Allowing for the increasing quantity of individual channels ($\sim l/d^2$), there is, on balance, a reduction in conductance $\sim d$. This can be used to reduce the depth l (structural depth or thickness) of the structure plates 53 and 54. Thus, taken as a whole, the entire filter structure 41 can be scaled to smaller channel dimensions with a slight reduction in conductance. This contributes to a stricter limiting of the buffer gas volume—to the gas cell 55—and to an increase in the total integral of path times gas density.

In a preferred construction—as is shown in a top view of one of the filter plates 53, 54 in FIG. 7—the function of a filter structure 41 of the kind described above is achieved in that the filter structure 41 is no longer composed of individual blades (as is FIG. 2 or FIG. 6b) or hexagonal structures 56 (as in FIG. 6c), but rather is produced from a solid metal plate (preferably with a thickness of approximately 2 mm) by micromaterials machining methods (erosion, etching, laser drilling, laser cutting, etc.). In this connection, elongated holes 58 are preferably arranged instead of rotationally symmetric channels 57 (FIG. 6c) in order to limit shadowing effects for the radiation emitted from the plasma 1. The arrangement is carried out with a view to stability in order to retain sufficient supporting material between the elongated holes. Typical diameters of the elongated holes 58 or channels 57 are 100 μm (width of the elongated holes). For a reasonable wall thickness, there should remain about 10 μm.

As is indicated in FIG. 6a, the implementation of narrowed channels 57 results in an intermediate space resembling a gas cell 55 which terminates on the inlet side and outlet side for the EUV radiation by correspondingly fine channels 57. The buffer gas 5 introduced into this gas cell 55 is distributed uniformly and homogeneously because of the more strictly limited volume. Since the total drop in pressure between the cell 55 and the vacuum chamber 6 occurs over a path length of about 2 mm only, the integral over path times density can now be increased up to twofold compared to a conventional debris filter 4 (see FIG. 8 for comparison) while maintaining the same gas load in the system.

All of the assumptions discussed above relating to the orientation of the channels 57 and their defining walls on the source point (plasma 1) and the axis 31 of the collector optics 3 for minimized shadow effects on the emitted radiation still apply without exception to a filter structure 41 of this kind.

Perforated plates in a hexagonal structure 56 of cylindrical or conical channels 57 afford the simplest topology for the filter structure 41 indicated in FIG. 6c and a transparency of about 80% can be achieved in this way, e.g., where $r_1/r_2 = 0.95$.

Compared to the hexagonal structure 56 shown in FIG. 6*c*, although the latter has cylindrical channels 57, another useful topology for the filter plates 53 and 54, shown in FIG. 7, which is provided by individual, radially oriented elongated holes (e.g., made by laser cutting) has the advantage of increased transmission, particularly when the light source (e.g., Z-pinch plasma 1) extends to a significant degree along the central surface normal (=axis of symmetry=optical axis 31) of the filter structure 41.

Figure 10:
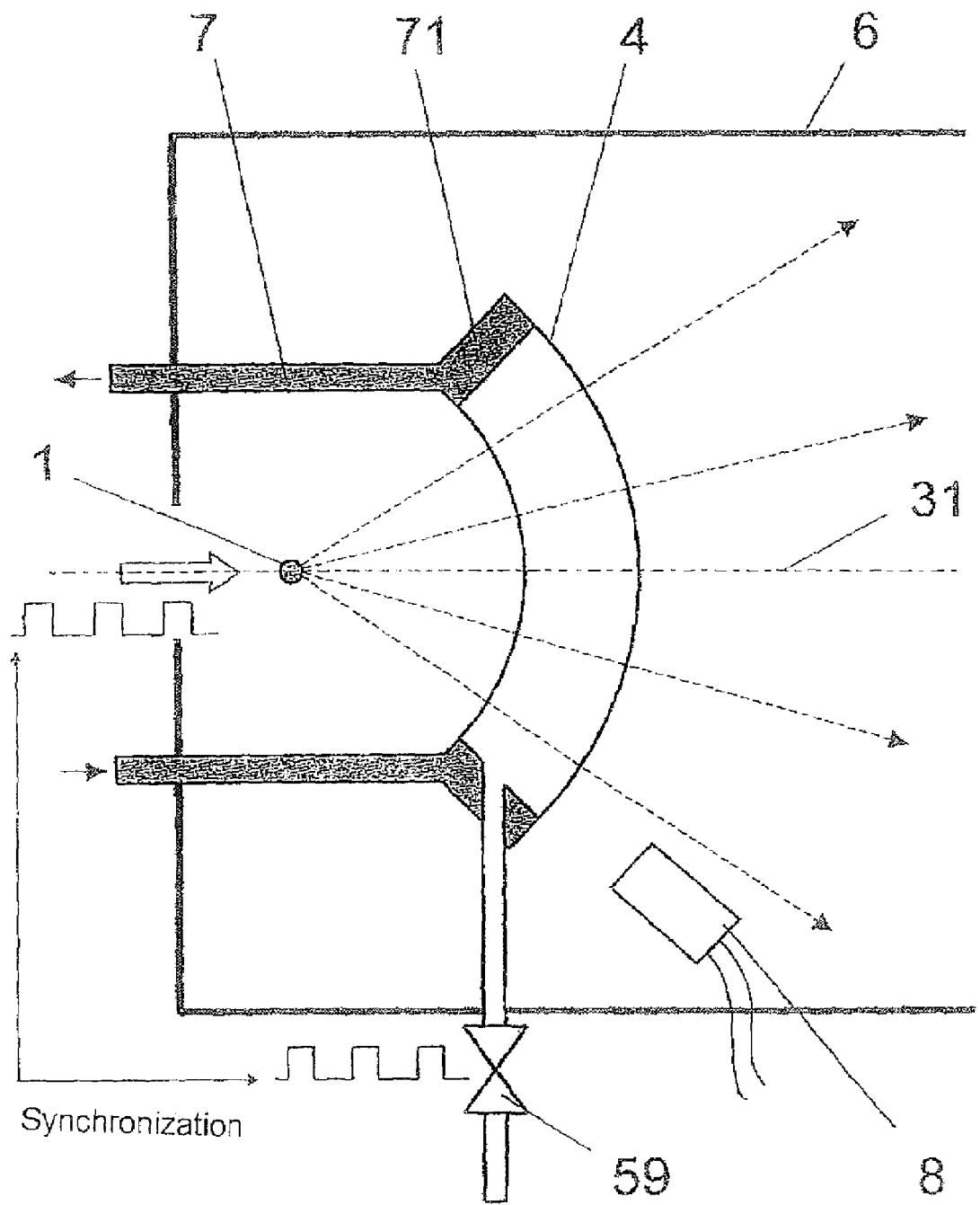
FIG. 10 shows a debris filter with means for limiting the gas load in the vacuum chamber for pulsed injection of buffer gas and means of cooling the filter structure.

Since, as a rule, the maximum available suction capacity of the vacuum pumps 61 connected to the vacuum chamber 6 is limited, the buffer gas 5 is introduced into the debris filter 4, as shown in FIG. 10, synchronous to the radiation pulses (of the plasma 1 which is normally generated in a pulsed manner) by a valve 59 that is operated in bursts. Temporarily higher pressures are realized in the debris filter 4 exclusively during the radiation emission of the plasma 1 so that the average pressure and the gas load in the vacuum chamber 6 are increased appreciably less and therefore do not require increased pumping capacity of the vacuum pumps 61.

Depending on the flow dynamics in the debris filter 4 and the repetition rate at which the EUV source is operated, the valve 59 can be triggered synchronous to each individual radiation pulse or synchronous to the pulse sequences (bursts) commonly used in lithography. The delay between the radiation pulse (or burst) and the triggering of the valve 59 is selected in such a way that the greatest possible debris reduction results.

During operation, the buffer gas 5 is heated and (partially) ionized with every radiation pulse through radiation absorption. Both heating and ionization lead to an expansion, and therefore a loss in density, of the buffer gas cloud inside the filter structure 41. The "lost" buffer gas must be replaced by new buffer gas 5. When the buffer gas 5 (typically a heavy noble gas such as argon) is mixed with a light gas (e.g., helium), the expansion of this gas mixture from the inlet nozzles 51 takes place faster in case of a supersonic nozzle jet expansion. Therefore, the buffer gas 5 is more quickly available. At high repetition frequencies also, this has a beneficial effect on the absorption behavior of the debris filter 4 that is filled with buffer gas.

The thermal conductivity of the gas mixture is also improved by adding a light gas (e.g., helium) to the heavy buffer gas (e.g., argon). This promotes cooling of the debris filter 4 which is likewise shown in FIG. 10.

The need to cool the debris filter 4 arises for two reasons: The density of the buffer gas 5 (particles per volume) is the decisive quantity for the efficiency of the debris filter 4. According to the general law of kinetic gas theory, density and temperature are inversely proportional. With the pressure remaining the same, twice the absolute temperature equals half of the particle density. The system is exposed to drastic heating at targeted outputs in commercial lithography systems. Therefore, cooling of the debris filter 4 is indispensable for prolonging the life of the system.

Further, steps must be taken respecting the structural stability of the filter structure 41. For this purpose, the filter structures 41 of the debris filter 4, which—without limiting generality—are shown as blades 43 in FIG. 11, are connected on one side to an annular holder. This holding ring 46 is actively cooled by means of a suitable coolant (e.g., water) in an added cooling structure 47. Accordingly, in addition to the cooling of radiation, the blades are cooled through thermal conduction from the blades to the ring. For this purpose, the filter structure 41 is made of a heat-resistant material with good heat-conducting properties such as tungsten, molybdenum or alloys thereof.

As was already indicated above, the cooling of the debris filter 4 is improved in that a light gas with good thermal conductivity, preferably helium or hydrogen, is mixed with the buffer gas of heavy atomic weight.

In order to prevent warping of the filter due to thermal expansion of the blades 43, the latter are fixedly connected to the holder of a cooled supporting ring 44 only on the cooled side and are guided (see FIG. 11) into a slot of a slide guide 49 on the opposite side. The slide guide can be incorporated in another supporting ring 44 or in the central diaphragm 45 of the debris filter 4.

FIG. 9 shows further modifications of the debris filter 4 which also relate to the thermal stability of the filter structure 41. Since the collector optics 3 arranged downstream in the beam path do not intercept EUV radiation on the axis 31 or at small angles to the axis 31, the debris filter 4 generally terminates in the central region by a diaphragm 45. As a result, this region is exposed to a large particle flow which must be absorbed through the central diaphragm 45. This inevitably leads to sputtering effects, i.e., the diaphragm 45 is cut by the particle flow in that material is removed. This removed material, as secondary debris, poses an additional threat to optical components, etc., and subsequently leads to the uncontrollable destruction of the diaphragm 45. It was found in experiments that after a fairly long time holes were formed in a plate of the diaphragm 45 having a thickness of 2 mm, since a self-focusing flow of electrons takes place on the optical axis of the radiation source. On the other hand, the ion flow from the plasma 1 is assumed to be approximately isotropic.

The destruction of the material of the central diaphragm 45 described above can be prevented, according to FIG. 9*a*, by constructing the central region of the debris filter 4 in the form of a diaphragm cup 46 which opens toward the plasma 1. When this diaphragm cup 46 is filled under sufficient pressure with a gas, preferably the buffer gas 5 that is provided for injecting into the filter structure 41, the particle flow is absorbed and decelerated in the gas phase. The particles from the particle flow are subsequently mostly neutralized and have a low thermal speed so that the sputtering effect of the particles is reduced to zero.

Another modification for the central diaphragm 45 according to FIG. 9*b* shows the construction as diaphragm cup 46 with the input region being supplemented by an electric lens 47 (in the form of a coil or electrically charged pinhole diaphragm). The electron flow from the plasma 1 is expanded through this lens 47 and its sputtering effect at the bottom of the diaphragm cup 46 is substantially reduced.

FIG. 9*c* shows another useful modification of the diaphragm 45 in which a conical pocket hole 48 is introduced in the latter. This can also considerably reduce the sputtering effect of the self-focusing electrons and other debris particles. In this case, the particles strike the body of the diaphragm 45 at a flat angle to the surface. Material that is removed from the walls of the pocket hole 48 settles again on the walls so that the material removed and the material deposited balance each other on the average and the life of the central diaphragm 45 is increased considerably.

Many particles which are emitted from the plasma 1 and pass the debris filter 4 are electrically charged. As was already proposed in Patent DE 102 37 901 B3, it is useful to set the debris filter 4 or individual blades 43 to an electric potential.

In an arrangement which can be realized according to FIG. 11, but which is not shown explicitly, differently charged blades 43 can also be used to improve the filtering of charged debris particles. For this purpose, the sliding members 49 are constructed so as to be electrically insulated and adjacent blades 43 of different polarity are fastened in a "meshing" manner (i.e., guided in the sliding member 49 in an insulated manner and alternately held in different supporting members 44 with opposite polarity). For this purpose, the schematic top view in FIG. 11 must be arranged in additional interspersed guides in an offset manner by an arrangement comprising cooling structure 71, supporting ring 44 and blades 43 which is mirrored at the sliding member 49.

Since kinetic energies of debris particles can reach several keV, corresponding DC voltages of up to several tens of kV would have to be applied in order to deflect or decelerate the particles. In order to prevent the expected parasitic discharges due to the residual gas within the vacuum chamber 6, the voltage is applied only in a pulsed manner to the blades 43 which are guided so as to be insulated. Pulse lengths of less than one microsecond are advisably selected for applying voltage so briefly that no gas discharge takes place in the vacuum chamber 6 around the debris filter 4 (typical times are several hundred nanoseconds). Instead of the debris filter 4, the collector optics 3 arranged downstream can also be provided with electrical contact in the same way.

When the debris filter 4 is mounted in the vacuum chamber 6 so as to be electrically insulated, the self-centering electron beam from the plasma 1 (see remarks with reference to FIG. 9) can be used to electrically charge the debris filter 4 synchronous to the radiation pulses.

High-energy electromagnetic radiation which is absorbed on the collector optics 3 leads to the emission of photoelectrons. In this way, the collector optics 3 can be charged to high voltages resulting in parasitic discharges to other particles in the vacuum chamber 6. Therefore, it is advisable to contact or ground the optics so that the electric charge can be dissipated in a targeted manner. This prevents discharges from the collector optics 3 to other components in the vacuum chamber 6. The other components can also be grounded or connected to another defined potential if necessary.

When target materials that are solid under normal conditions (e.g., tin) are used to generate the plasma 1, the debris filter 4 and the collector optics 3 arranged downstream should be heated (temperature-controlled) to the extent that the surface temperature lies above the condensation temperature (dew point) of the material. This prevents target material from depositing at undesirable locations and therefore in particular prevents impairment of the operation of the collector optics 3 and debris filter 4.

The purpose of collector optics 3 in an EUV radiation source is to focus substantial portions of the radiation emitted from the plasma 1 in an intermediate focus 2. Therefore, it may be advisable to arrange an (additional) debris filter 4 around this intermediate focus 2 in order to further reduce the transfer of debris for the application downstream.

A further improvement in the long-term stability of the debris filtering is achieved by continuously monitoring the quality of the debris filtering. For this purpose, a sensor 8 for detecting the actual debris reduction is installed downstream of the debris filter. This sensor 8 picks up a measurement quantity representing the actual amount of debris that is passed. For this purpose, the sensor 8 can be a film sensor, as it is called, in which a quartz resonator whose resonant frequency can be measured very accurately is inserted into the beam path. Its resonant frequency is detuned when deposits are formed on its surface or sputtering takes place on its surface as a result of passed debris. Therefore, the change in its resonant frequency (df/dt) is a measure for the amount of debris emitted.

Another type of sensor within the meaning of the invention is a sensor 8 that measures the energy (velocity), type (charge state), or amount of emitted particles. This type of sensor includes particle analyzers, e.g., mass spectrometers, time-of-flight spectrometers and related devices.

When an unusually severe detuning takes place, the control of the radiation source and/or the superordinate lithography system is alerted to a defect in the debris filter (poor debris filtering) or to a defect in the source function (severe generation of debris).

The signal of a sensor of this kind can then be used within the framework of the present invention so that parameters of the debris filter 4 (e.g., buffer gas flow or applied voltages, etc.) that can vary during operation can be tracked in the manner of a closed control loop.

While the foregoing description and drawings represent the present invention, it will be obvious to those skilled in the art that various changes may be made therein without departing from the true spirit and scope of the present invention.

REFERENCE NUMBERS

1 plasma
2 intermediate focus
3 collector optics
31 optical axis
32 collector mirror
4 debris filter
41 (any) filter structure
42, 42' blade structures
43 blade
44 supporting ring
45 central diaphragm
46 cup diaphragm
47 electric lens
48 conical pocket hole
49 sliding guide
5 buffer gas
51 buffer gas nozzle
52 intermediate space
53 filter plate
54 filter plate
55 gas cell
56 hexagonal structure
57 channel
58 elongated hole
59 (pulsed) valve
6 vacuum chamber
61 vacuum pump
62 antechamber (in front of the debris filter)
63 buffer gas (flowing out of the discharge chamber)
64 outlet opening
65 suction pump
7 cooling circuit
71 cooling structure
8 sensor

What is claimed is:

1. A method for suppressing debris in short-wavelength radiation sources based on a plasma in which the short-wavelength radiation emitted in a vacuum chamber from the plasma as source location is guided through a debris filter having at least one mechanical filter structure before this radiation reaches collector optics for focusing the radiation in an intermediate focus, comprising the steps of:

injecting a buffer gas inside the filter structure of the debris filter lateral to openings that are provided for passing the radiation, wherein the filter structure generates a flow resistance in direction of the plasma and in direction of propagation of the radiation so that an increased gas pressure of buffer gas remains limited to a defined volume layer in the debris filter relative to the pressure in the vacuum chamber; and sucking the buffer gas exiting from the filter structure of the debris filter out of the vacuum chamber by vacuum pumps.

2. The method according to claim 1, wherein the buffer gas is injected into an intermediate space between two filter structures.

3. The method according to claim 1, wherein the buffer gas is injected into an intermediate space between two filter structures with constricted channels, wherein the constricted channels are suitably formed openings for the radiation emitted from the plasma.

4. The method according to claim 1, wherein additional buffer gas is directed into an antechamber in front of the debris filter.

5. The method according to claim 4, wherein the antechamber is filled with residual gas which flows out of a discharge chamber for generating the plasma and contains a proportion of buffer gas.

6. The method according to claim 4, wherein the buffer gas is sucked out of the antechamber into the vacuum chamber through outlet openings in order to minimize the buffer gas flowing out of the antechamber through the filter structure.

7. The method according to claim 6, wherein the buffer gas is sucked out in a defined manner by separate suction pumps in order to adjust a defined gas pressure in the antechamber on the order of 10 Pa.

8. The method according to claim 1, wherein buffer gas is introduced into a central diaphragm of the debris filter in order to suppress erosion of the diaphragm.

9. The method according to claim 1, wherein the pressure of the buffer gas which continuously drops in the debris filter as a result of the buffer gas flowing out through said at least one filter structure into the vacuum chamber, is increased by bursts of pulsed influxes of buffer gas into the filter structure synchronous to a pulsed radiation.

10. An arrangement for the suppression of debris in short-wavelength radiation sources based on a plasma comprising:

a debris filter having at least one mechanical filter structure arranged in a vacuum chamber between the plasma, as source location of the emitted short-wavelength radiation, and in front of collector optics for focusing the radiation in an intermediate focus; and inlet nozzles for injecting a buffer gas into the filter structure being arranged inside the filter structure of the debris filter lateral to openings that are provided for the passage of the radiation;

wherein said filter structure has a flow resistance in direction of the plasma and in direction of propagation of the radiation so that a defined volume layer in the debris filter has an increased gas pressure of buffer gas compared to the pressure in the vacuum chamber, and at least one vacuum pump for evacuating the vacuum chamber is also provided for sucking out the buffer gas exiting from the filter structure of the debris filter.

11. The arrangement according to claim 10, wherein the debris filter has at least one blade structure.

12. The arrangement according to claim 11, wherein the debris filter has closely adjacent blades which are oriented radial to an optical axis of the collector optics and at least two supporting rings for the blades, which are oriented in a conical shape toward the source location.

13. The arrangement according to claim 12, wherein the debris filter has a different quantity of radially oriented blades between different pairs of supporting rings, wherein the quantity of blades increases outward from the optical axis.

14. The arrangement according to claim 13, wherein the debris filter has at least two pairs of supporting rings, wherein the quantity of blades between a pair of supporting rings situated farther toward the outside is greater than the number of blades between the closest pair of supporting rings toward the inside.

15. The arrangement according to claim 10, wherein the debris filter has two filter structures with a parallel volume layer situated therebetween for injecting buffer gas into an intermediate space.

16. The arrangement according to claim 15, wherein the filter structures have a greater flow resistance for the buffer gas because of a reduced diameter of the openings for the passage of radiation.

17. The arrangement according to claim 16, wherein the filter structures have a smaller structural depth in direction of the radiation from the plasma, and a higher buffer gas pressure can be adjusted while maintaining the same supply of buffer gas between the filter structures so that the reduced structural depth does not result in a reduced product of debris particle path and buffer gas density or diminish the filtering action.

18. The arrangement according to claim 15, wherein at least one filter structure is constructed as a close blade structure with comparably closely adjacent supporting rings so that the filter structure has approximately square channels.

19. The arrangement according to claim 17, wherein at least one filter structure is constructed as a filter plate, wherein holes that are suitably arranged in the filter plate are introduced as openings for the passage of the radiation emitted from the plasma.

20. The arrangement according to claim 19, wherein at least one filter structure is constructed as a hexagonal structure with bore holes.

21. The arrangement according to claim 19, wherein at least one filter structure is constructed as a filter plate, wherein radially oriented elongated holes are introduced in the filter plate.

22. The arrangement according to claim 10, wherein the filter structure has a circular central diaphragm.

23. The arrangement according to claim 22, wherein the central diaphragm is constructed as a diaphragm cup which opens toward the plasma and in which buffer gas can be introduced.

24. The arrangement according to claim 22, wherein the central diaphragm is constructed as a diaphragm cup which opens toward the plasma and an electric lens is arranged around the opening for deflecting charged particles, particularly electrons.

25. The arrangement according to claim 22, wherein the central diaphragm is solid and is provided with a conical pocket hole that is introduced symmetric to the optical axis.

26. The arrangement according to claim 13, wherein the blades are rigidly fixed only in one supporting ring and are guided in a sliding manner in another supporting ring so as to enable thermal expansion of the blades without warping.

27. The arrangement according to claim 26, wherein a cooling structure is arranged at the supporting ring at which the blades are rigidly fixed.

28. The arrangement according to claim 10, wherein the filter structure of the debris filter is actively cooled by means of a cooling circuit to further increase the density of the buffer gas.

29. The arrangement according to claim 10, wherein the filter structure of the debris filter is actively cooled by a cooling circuit in such a way that temperature is maintained at a minimum value which lies above the condensation temperature of materials that are solid under normal conditions and are at least partially in a vaporized state in the vacuum chamber.

30. The arrangement according to claim 29, wherein the minimum value to which the temperature is adjusted in such a way that the surface temperature of the filter structure lies above the condensation temperate of a target material that is solid under normal conditions.

31. The arrangement according to claim 10, wherein the filter structure of the debris filter is made from heat-resistant material with good thermal conductivity.

32. The arrangement according to claim 31, wherein the filter structure is made from at least one of the metals tungsten and molybdenum, or an alloy thereof.

33. The arrangement according to claim 10, wherein at least one valve is provided for injecting the buffer gas into the filter structure of the debris filter, which valve is operated by bursts so as to be synchronized with a pulsed radiation generation from the plasma.

34. The arrangement according to claim 33, wherein the pulsed valve for injecting the buffer gas by bursts is synchronized to every individual radiation pulse from the plasma.

35. The arrangement according to claim 33, wherein the pulsed valve for injecting the buffer gas by bursts is continuously active so as to be synchronized by a burst of radiation pulses from the plasma.

36. The arrangement according to claim 12, wherein inlet nozzles which are suitable for a supersonic nozzle jet expansion of the buffer gas into the gaps between the blades of the blade structure are provided for injecting the buffer gas laterally under high pressure.

37. The arrangement according to claim 10, wherein an inert gas, preferably a noble gas, is used as buffer gas.

38. The arrangement according to claim 37, wherein the buffer gas is a mixture of at least a heavy noble gas and a light noble gas in order to achieve faster influx and better thermal conductivity.

39. The arrangement according to claim 12, wherein the blade structure is constructed so as to be insulated in such a way that an additional deflection of charged debris particles is provided by applying high-voltage pulses.

40. The arrangement according to claim 10, wherein the filter structure is constructed so as to be insulated in such a way that a charging of the filter structure for deflecting charged debris particles is provided by a self-focused electron beam impinging on a central diaphragm.

41. The arrangement according to claim 12, wherein the blade structure is constructed so as to be insulated in such a way that adjacent blades can be charged in a pulsed manner with different potential.

42. The arrangement according to claim 10, wherein a defined potential is applied to the filter structure for preventing parasitic discharges in the vacuum chamber.

43. The arrangement according to claim 10, wherein a similarly constructed debris filter is arranged in the vicinity of the intermediate focus for further reduction of debris.

44. The arrangement according to claim 10, wherein a sensitive sensor for monitoring or controlling optimal debris suppression is arranged downstream of the debris filter.

45. The arrangement according to claim 44, wherein the sensor is a film sensor with tunable quartz resonator.

46. The arrangement according to claim 44, wherein the sensor is a miniaturized mass spectrometer.

47. The arrangement according to claim 44, wherein the sensor is a miniaturized time-of-flight spectrometer.

48. The arrangement according to claim 44, wherein the sensor is provided for generating an error report for the control of plasma generation or of a superordinate lithography system.

49. The arrangement according to claim 44, characterized in that the sensor is provided for regulating active filter parameters, preferably buffer gas pressures, influx angles, voltages or pulse synchronization.

* * * * *